(12) United States Patent
Busse et al.

(10) Patent No.: US 7,276,904 B2
(45) Date of Patent: Oct. 2, 2007

(54) METHOD FOR GENERATING T1-WEIGHTED MAGNETIC RESONANCE IMAGES AND QUANTITATIVE T1 MAPS

(75) Inventors: Reed F. Busse, San Mateo, CA (US); John M. Pauly, Redwood City, CA (US); Greg Zaharchuk, San Francisco, CA (US)

(73) Assignee: General Electric Company, Schenectady, NY (US)

( * ) Notice: Subject to any disclaimer, the term of this patent is extended or adjusted under 35 U.S.C. 154(b) by 126 days.

(21) Appl. No.: 11/136,194

(22) Filed: May 24, 2005

(65) Prior Publication Data

US 2006/0267584 A1   Nov. 30, 2006

(51) Int. Cl.
*G01V 3/00* (2006.01)
(52) U.S. Cl. ...................... 324/309; 324/318
(58) Field of Classification Search .............. 324/309, 324/307, 306, 300, 318, 322; 600/410
See application file for complete search history.

(56) References Cited

U.S. PATENT DOCUMENTS

| | | | |
|---|---|---|---|
| 4,734,646 A | | 3/1988 | Shenoy et al. |
| 5,565,777 A | * | 10/1996 | Kanayama et al. ......... 324/309 |
| 5,694,934 A | * | 12/1997 | Edelman ..................... 600/410 |
| 6,219,571 B1 | * | 4/2001 | Hargreaves et al. ........ 600/410 |
| 6,603,989 B1 | * | 8/2003 | Yablonskiy ................. 600/410 |
| 6,804,546 B1 | * | 10/2004 | Thompson et al. ......... 600/410 |
| 6,823,205 B1 | * | 11/2004 | Jara ............................ 600/410 |

OTHER PUBLICATIONS

S. Jarnum, M.D., I. Lorenzen, M.D., and E. Skinhøj. M.D., "Cisternal Fluid Oxygen Tension In Man," Neurology, Aug. 1964, Official Journal Of The American Academy Of Neurology, St. Paul, MN, pp. 703-707.

Anastasia V. Deliganis, M.D., David J. Fisher, M.D., Ph.D., Arthur M. Lam, M.D., and Kenneth R. Maravilla, M.D., "Cerebrospinal Fluid Signal Intensity Increase On FLAIR MR Images in Patients Under General Anesthesia: The Role Of Supplemental $O_2$1" Radiology, 2001, Radiology Society Of North America, Oak Brook, IL, pp. 152-156.

N. Bloembergen, "Proton Relaxation Times In Paramagnetic Solutions," Journal of Chemical Physics, Aug. 1957, American Institute Of Physics, Melville, NY, pp. 572-573.

G. Chiarotti, G. Christiani, and L. Giulotto, "Proton Relaxation In Pure Liquids And In Liquids Containing Paramagnetic Gases In Solution," Illinois Nuovo Cimento, vol. 1, N:5, Mar. 1955, Italian Physical Society, Bologna, Italy, pp. 863-873.

A. L. Hopkins, H.N. Yeung and C.B. Bratton, "Multiple Field Strength In Vivo T1 and T2 For Cerebrospinal Fluid Protons," Magnetic Resonance In Medicine, 1985-1986, International Society For Magnetic Resonance In Medicine, Berkeley, CA, pp. 303-311.

M.E. Mirhej, "Proton Spin Relaxation By Paramagnetic Molecular Oxygen," Canadian Journal Of Chemistry, 1965, The Canadian Society For Chemistry—the Chemical Institute Of Canada, Ottawa, Ontario, Canada, pp. 1130-1138.

\* cited by examiner

*Primary Examiner*—Brij B. Shrivastav
(74) *Attorney, Agent, or Firm*—Small Patent Law Group; Dean D. Small

(57) ABSTRACT

Methods and systems for generating T1-weighted images are provided. The method includes acquiring a pair of single-shot fast-spin-echo (SSFSE) images $S_1$ and $S_2$. The method further includes generating a T1-weighted image $S_{T1w}$ based on $S_1$ and $S_2$.

17 Claims, 7 Drawing Sheets
(1 of 7 Drawing Sheet(s) Filed in Color)

METHOD FOR GENERATING T1-WEIGHTED MAGNETIC RESONANCE IMAGES AND QUANTITATIVE T1 MAPS

BACKGROUND OF THE INVENTION

This invention relates generally to medical imaging systems, and more particularly, to methods and systems for generating purely T1-weighted images using data from two or more acquisitions.

Magnetic Resonance Imaging (MRI) generates an image based on a plurality of properties specific to a material of an object being imaged. One of the properties is a longitudinal relaxation time T1 and another one of the properties is a transverse relaxation time T2. Known imaging methods generate images by applying a sequence of Radio Frequency (RF) pulses to the object. This sequence is repeated periodically after a time interval TR. The signal produced by the object after applying RF pulses depends on the material of the object and the T1 of that material. MRI employs the property of different T1 relaxation rates for the material of the object to obtain contrast within the image. The image obtained by emphasizing T1 and de-emphasizing T2 of the material is referred to as a T1-weighted image.

The known methods for obtaining the T1-weighted image make use of an inversion or saturation recovery techniques. The inversion recovery technique utilizes a long repetition time and thus results in a long scan time. Saturation recovery techniques may utilize short values of TR. However, short values of TR produce low intensity signals from the object, such as a fetal brain, that have long T1 values. The low signals result in a poor signal-to-noise ratio (SNR). Further, long scans are not useful for the fetal brain because of motion of the fetal brain.

Partial pressure ($pO_2$) of oxygen measurements for fluids such as cerebrospinal fluid, amniotic fluid and urine may be a useful diagnostic tool for a variety of diseases. The $pO_2$ measurements are currently obtained by invasive procedures. However, the invasive procedures are prone to movement of the object and contamination from the environment in which the invasive procedures are performed. A relationship between the $pO_2$ of a fluid and the T1 of that fluid is known to exist. However, obtaining measurements of fluid T1 in order to estimate $pO_2$ has not previously been demonstrated in vivo.

BRIEF DESCRIPTION OF THE INVENTION

In an exemplary embodiment of the invention, a method for generating purely T1-weighted images is provided. The method includes acquiring a pair of Single-Shot Fast-Spin-Echo (SSFSE) images $S_1$ and $S_2$, and generating a T1-weighted image $S_{T1w}$ based on $S_1$ and $S_2$.

In another exemplary embodiment of the invention, a magnetic resonance imaging (MRI) system is provided. The MRI system includes a Radio Frequency (RF) coil configured to acquire a first set of MR signals and a second set of MR signals. A computer processor is configured to generate T2-weighted image data $S_1$ corresponding to the first set of MR signals, T1–T2-weighted image data $S_2$ corresponding to the second set of MR signals, and T1-weighted image data from the T2-weighted image data and the T1–T2 weighted image data.

BRIEF DESCRIPTION OF THE DRAWINGS

The patent or application file contains at least one drawing executed in color. Copies of this patent or patent application publication with color drawing(s) will be provided by the U.S. Patent and Trademark Office upon request and payment of the necessary fee.

DETAILED DESCRIPTION OF THE INVENTION

Various embodiments of the invention provide a method and system for generating T1-weighted Magnetic Resonance (MR) images and quantitative T1 maps. The method is performed by acquiring a pair of Single-Shot Fast-Spin-Echo (SSFSE) images.

Figure 1:
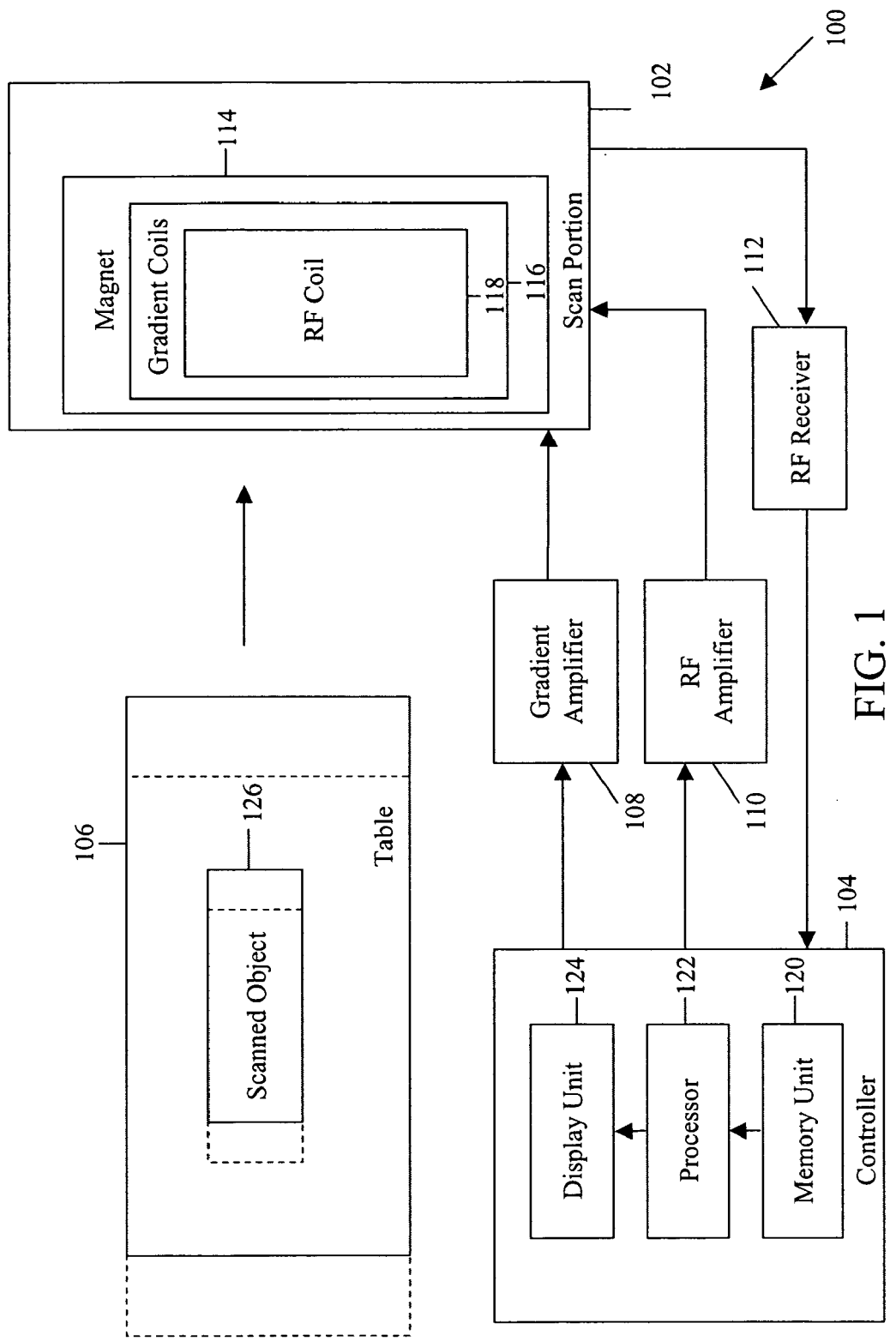
FIG. 1 is a block diagram of an MRI system, in which various embodiments of the invention can be implemented.

FIG. 1 is a block diagram of an MRI system 100, in which various embodiments of the invention can be implemented. MRI system 100 generally includes a scan portion 102, a controller 104, a table 106, a gradient amplifier 108, an RF amplifier 110, and an RF receiver 112. Scan portion 102 includes a magnet 114, a set of gradient coils 116, and an RF coil 118. Controller 104 includes a memory unit 120, a processor 122 and a display unit 124.

In an embodiment of the invention, an object 126 (e.g., a patient) to be scanned is placed on table 106. MRI data of object 126 is obtained by scan portion 102. This is achieved through the application of a magnetic field generated by magnet 114, a plurality of magnetic gradient fields, along x, y, and z directions, generated by a set of gradient coils 116, and a plurality of RF pulses generated by RF coil 118. In an embodiment of the invention, the magnetic field is produced by magnet 114, wherein, for example, a super-conducting magnet extends through the entire magnet 114 and generates a homogenous magnetic field throughout its length. Furthermore, the gradient applied by a set of gradient coils 116, produces a variation in the magnetic field, along a desired direction. The RF pulses generated by RF coil 118, in combination with the fields, excite protons in an object 126. Protons of a plurality of tissues of object 126 spin on their axis, and have their own magnetic moment.

The magnetic field is applied by magnet 114 on object 102. The magnetic field gradients are applied. Additionally, the RF pulses are applied for a predefined time by RF coil 118 to generate an initialization magnetization. The RF pulses disorient some protons and the initial magnetization is changed. Subsequently, after completion of the application of the RF pulses, the protons tend to attain the initial magnetization, and in this process release energy in the form of MR signals.

In various embodiments of the invention, the MR signals are received by RF coil 118 and converted into electrical signals by RF receiver 112. Amplitudes of MR signals are dependent on relaxation characteristics and spin densities of the protons present in object 126. Relaxation characteristics of the tissues include longitudinal relaxation time, T1 and a transverse relaxation time, T2. The electrical signals are analog signals, which in various embodiments of the invention, can be converted to digital signals with the use of an analog to digital converter (not shown) and sampled by processor 122 to generate MRI data. The MRI data received by processor 122 is stored in memory unit 120. In accordance with an embodiment of the invention, processor 122 performs an image reconstruction, and the resultant image is displayed on display unit 124. In various embodiments of the invention, processor 122 may include, for example, a set of processors that can communicate with each other to perform an image reconstruction on the MRI data. In an embodiment of the invention, processor 122 performs multiple Fourier transforms on the MRI data, received by memory unit 120, as is known. In another embodiment of the invention, processor 122 performs a Fast Fourier transformation on the MRI data, received by memory unit 120, as is known.

In various embodiments of the invention, processor 122 is configured to define and/or specify shapes of a plurality of gradient pulses incorporating the magnetic gradient fields produced by the set of gradient coils 116. In accordance with an alternative embodiment of the invention, processor 122 is also used to define and/or specify shapes of the RF pulses generated by RF coil 118. The shapes of the gradient pulses and the RF pulses are communicated by processor 122 to gradient amplifier 108 and RF amplifier 110 respectively to generate amplified gradient signals and amplified RF signals respectively. The amplified gradient signals generated from gradient amplifier 108 are communicated to the set of gradient coils 116. Additionally, the amplified RF signals generated from RF amplifier 110 are communicated to RF coil 118. Thereafter, the set of gradient coils 116 generate the gradient pulses, based on the amplified gradient signals received from gradient amplifier 108, while RF coil 118 generates the RF pulses based on the amplified RF signals received from RF amplifier 110. The MR signals are generated from object 126 upon receiving the gradient pulses and the RF pulses. The MR signals are received by RF coil 118, after which they are converted to the MRI data and processed accordingly. A final image is generated from the MRI data and displayed on display unit 124.

In various embodiments of the invention, memory unit 120 may be, for example, a magnetic or an optical storage media, such as a hard disk, a tape drive, or a memory chip. Memory unit 120 also, may be other similar means for loading computer programs or other instructions into processor 122. Further, display unit 124 may include, for example, a cathode ray display, an LCD display, or a plasma display.

In an embodiment of the invention, object 126 is imaged by using a Single-Shot Fast Spin Echo (SSFSE) pulse sequence of Nuclear Magnetic Resonance (NMR). The SSFSE pulse sequence is also referred to as Rapid Acquisition with Relaxation Enhancement (RARE), Half Fourier Acquisition Single shot Turbo spin Echo (HASTE) or Turbo Spin Echo. The SSFSE pulse sequence is based on the nuclear characteristics of tissues in object 126, and the sequence of applied RF and gradient pulses.

In an exemplary embodiment of the invention, the SSFSE pulse sequence includes an excitation RF pulse and a plurality of refocusing RF pulses for one acquisition. In an embodiment of the invention, the refocusing RF pulses saturate the slice being imaged. The slice is saturated by destroying the longitudinal magnetization of the slice. Thereafter, a sequence of RF pulses for a subsequent SSFSE acquisition is applied. The subsequent sequence is applied before full recovery of the longitudinal magnetization of the slice being imaged. The time between the completion of the refocusing RF pulse train for one acquisition and an application of the excitation RF pulse for the subsequent SSFSE acquisition is referred to as saturation recovery time period, $T_{SR}$.

In an embodiment of the invention, RF coil 118 receives a set of MR signals corresponding to a sequence of RF pulses. The set of MR signals is received between refocusing RF pulses after an application of an excitation RF pulse of an RF pulse sequence. The set of MR signals received by RF coil 118 are sent to processor 122 for generating the MRI data, which is referred to as image data.

In various embodiments of the invention, processor 122 generates the image data from the MR signals received by RF coil 118. The contrast for an image can be manipulated to emphasize T1 or T2 characteristics of the tissues. The manipulation is done by varying $T_{SR}$ and TE of RF pulse sequences. T1-weighted image data includes data generated for forming an image based maximally on T1 and minimally on T2. Similarly, T2-weighted image data includes data generated based maximally on T2 and minimally on T1. Moreover, T1–T2-weighted image data includes data based on both T1 and T2. In an embodiment of the invention, the T1 characteristic of the protons is emphasized by varying the $T_{SR}$ of the two acquisitions. However, the T2 characteristic of the protons is emphasized identically in the two acquisitions.

Figure 2:
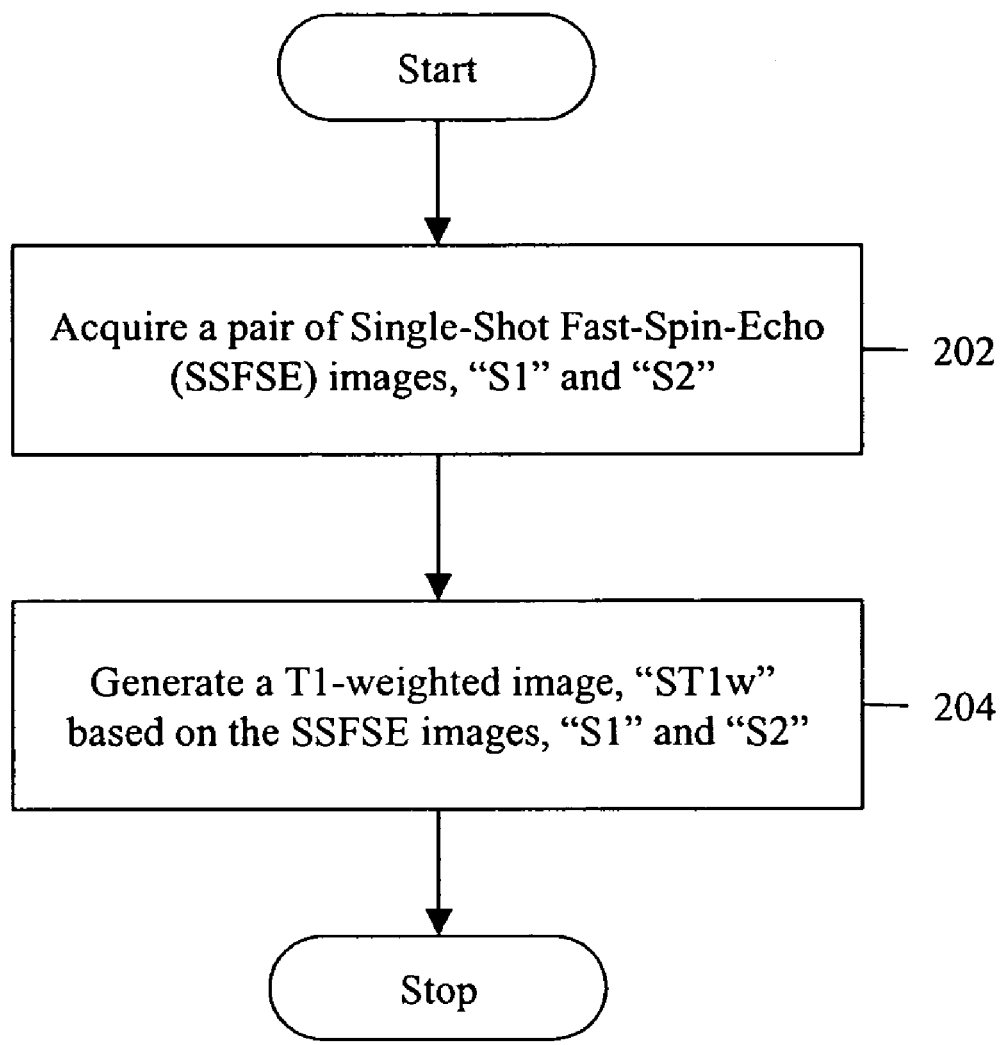
FIG. 2 is a flowchart of a method for generating a T1-weighted image, in accordance with an embodiment of the invention.

FIG. 2 is a flowchart of a method for generating a T1-weighted image, in accordance with an embodiment of the invention. At 202, a pair of SSFSE images, "$S_1$" and "$S_2$" is acquired. The pair of SSFSE images includes a first SSFSE image and a second SSFSE image. A T1-weighted image, "$S_{T1w}$" is generated based on $S_1$ and $S_2$, at 204. In an embodiment of the invention, the $T_1$-weighted image generated from the pair of SSFSE images is used to calculate T1. This is further explained in detail in conjunction with FIG. 3.

Figure 3:
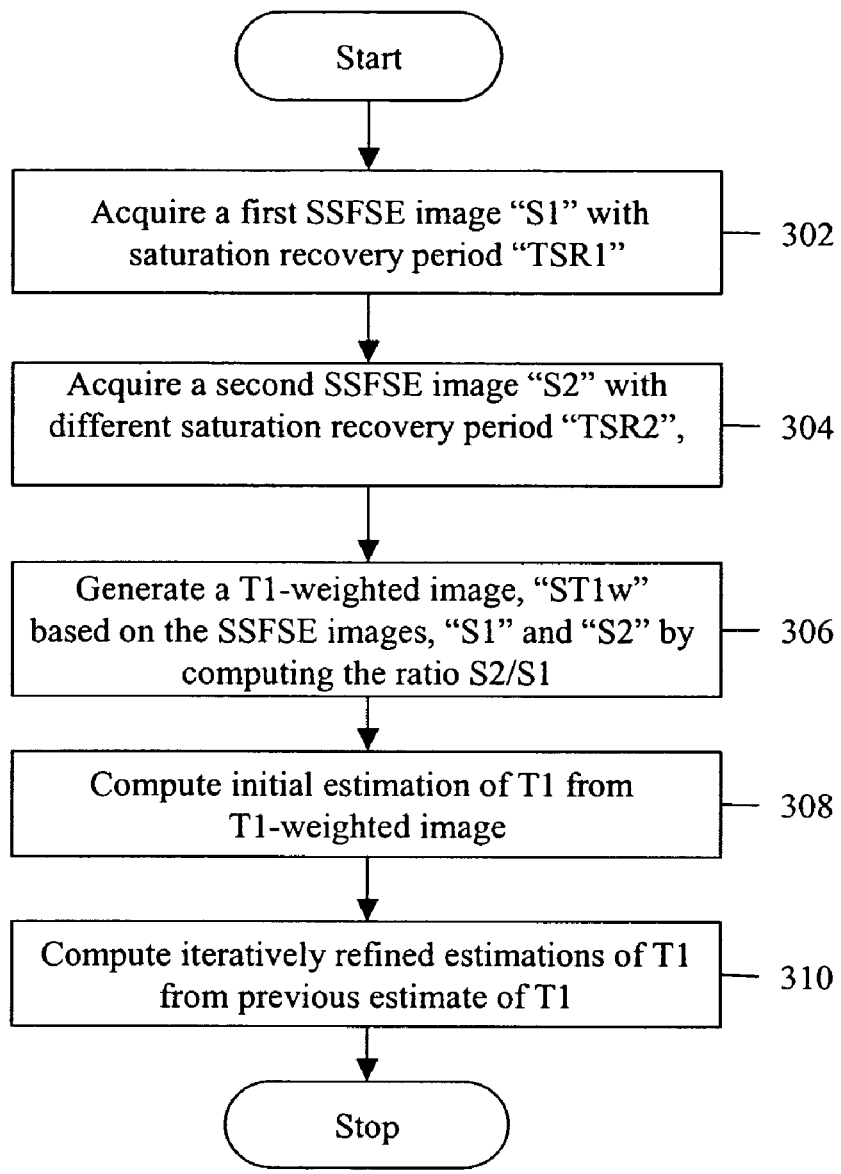
FIG. 3 is a flowchart of a method for generating a T1-weighted image and T1-map, in accordance with an embodiment of the invention.

FIG. 3 is a flowchart of a method for generating a T1-weighted image and a quantitative T1-map, in accordance with an embodiment of the invention. At 302, the first SSFSE image "$S_1$" is acquired. In an embodiment of the invention, the saturation recovery time, "$T_{SR1}$", preceding the acquisition of the image $S_1$, should be longer than the T1 of fluid. However, alternatively, $T_{SR1}$ may be shorter than T1.

At 304, the second SSFSE image "$S_2$" is acquired. The saturation recovery time, "$T_{SR2}$", preceding this acquisition, is shorter than $T_{SR1}$. However, other acquisition parameters used for acquiring $S_1$ and $S_2$ are identical. In an embodiment of the invention, multiple repetitions of $S_1$ and $S_2$ acquisitions is performed for averaging the $S_1$ acquisitions and the $S_2$ acquisitions, and to obtain a higher Signal-to-Noise-Ratio (SNR) than that obtained from a single acquisition of $S_1$ and a single acquisition of $S_2$. In another embodiment of the embodiment, multiple repetitions are performed and averaged for $S_1$ acquisition and not for $S_2$ acquisition. In yet another embodiment of the embodiment, multiple repetitions are performed and averaged for $S_2$ acquisition and not for $S_1$ acquisition. At 306, a T1-weighted image "$S_{T1w}$" is calculated from the $S_1$ image and $S_2$ image. At 308, an initial quantitative T1-map is calculated from $S_{T1w}$, which is described below. In an embodiment of the invention, the initial quantitative T1-map is calculated directly from $S_1$ and $S_2$. At 310, the quantitative T1-map is iteratively refined, based on a preceding T1-map and the $S_1$ and $S_2$ images acquired during a first of many acquisitions.

In an embodiment of the invention, the T1-weighted image, $S_{T1w}$ is obtained by calculating the ratio of $S_2$ and $S_1$ on a pixel-by-pixel basis:

$$S_{T1w} = \frac{S_2}{S_1} \quad (1)$$

In an embodiment of the invention, a mask may be applied to $S_{T1w}$ for suppressing noise in regions where there is little or no signal in image $S_1$ or $S_2$. $S_1$ and $S_2$ are described mathematically as follows:

$$S_1 = CM_0(1 - \exp(-T_{SR1}/T1))\exp(-TE/T2) \quad (2)$$
$$= CM_0\exp(-TE/T2) \text{ if } T_{SR1} \gg T1$$

$$S_2 = CM_0(1 - \exp(-T_{SR2}/T1))\exp(-TE/T2) \quad (3)$$

where, $M_0$ is the initial magnetization of the protons, and C is a function that includes coil sensitivity and measurement process that converts transverse magnetization into MR signal. Substituting the value of $S_1$ from equation (2) and $S_2$ from equation (3) in equation (1):

$$S_{T1w} = \frac{1 - \exp(-T_{SR2}/T1)}{1 - \exp(-T_{SR1}/T1)} \quad (4)$$
$$= 1 - \exp(-T_{SR2}/T1) \text{ if } T_{SR1} \gg T1$$

$S_{T1w}$ is a purely T1-weighted image. The purely T1-weighted image does not depend on T2-weighting of the image, coil sensitivity, and proton density.

In an embodiment of the invention, the initial quantitative T1-map, $T1_{est}$, is obtained by assuming that $T_{SR1}$ is substantially larger than $T_1$, i.e., $T_{SR1} \gg T1$, and by solving equation (4) for T1:

$$T1_{est} = \frac{-T_{SR2}}{\ln\left(1 - \frac{S_2}{S_1}\right)} \quad (5)$$

An example of $T_{SR1}$ that is substantially larger than T1 is $T_{SR1}$ that is equal to five times a value of $T_{SR1}$. Another example of $T_{SR1}$ that is substantially larger than T1 is $T_{SR1}$ that is greater than five times a value of $T_{SR1}$. In another embodiment of the invention, if $T_{SR1}$ is not substantially larger than T1, i.e., $T_{SR1} \gg T1$ is not valid, the quantitative T1-map is refined for obtaining T1. T1 is refined by iteratively determining an improved value of $T1_{est}$ at each pixel based on the previously determined $T1_{est}$:

$$T1'_{est} = \frac{-T_{SR2}}{\ln\left(1 - \frac{S_2}{S_1/(1 - \exp(-T_{SR1}/T1_{est}))}\right)} \quad (6)$$

In an embodiment of the invention, value of $T1_{est}$ is obtained by acquiring multiple $S_1$ and $S_2$ images and averaging the images as described above.

Figure 4:
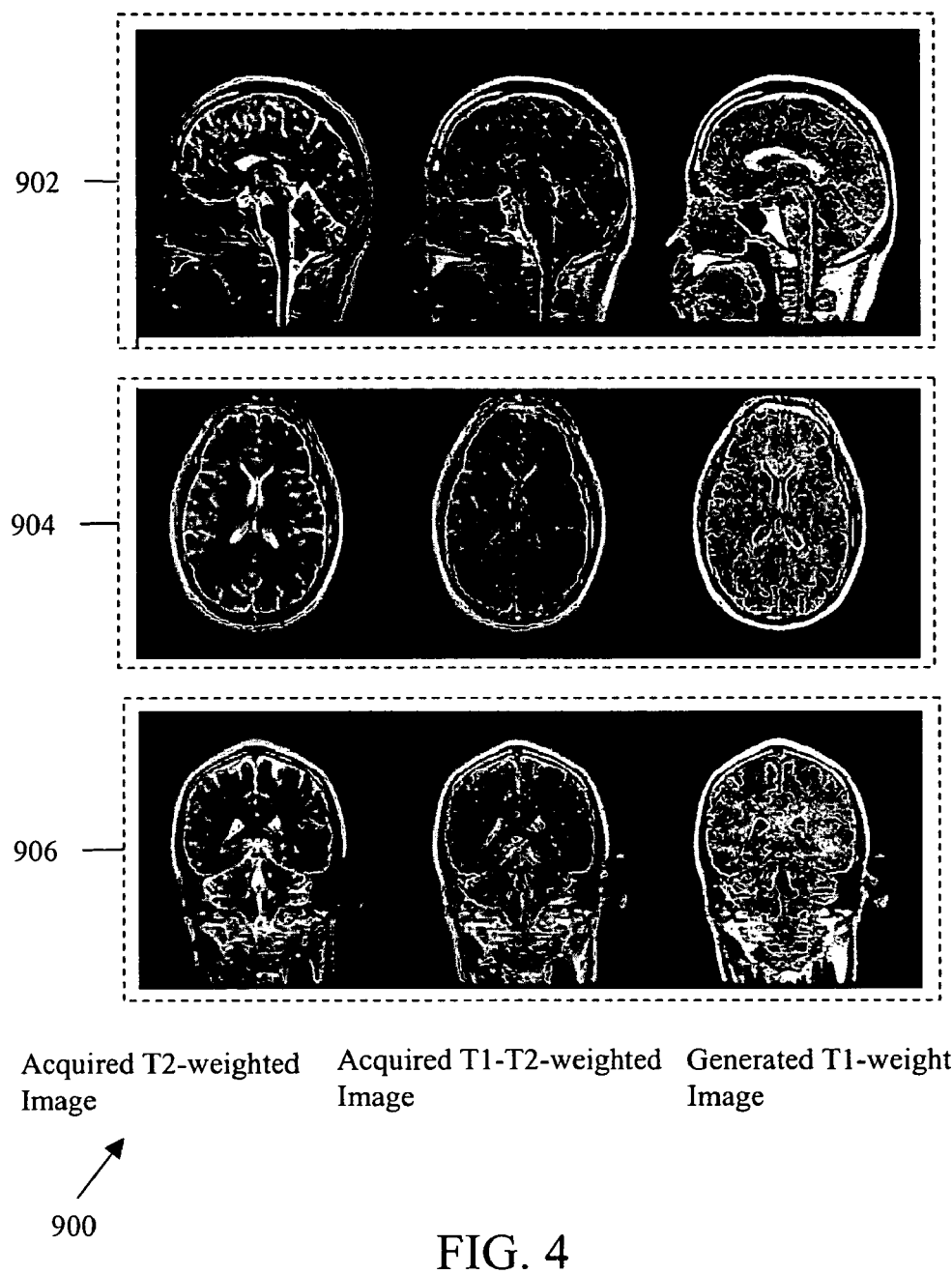
FIG. 4 is diagram illustrating generated T1-weighted images, in accordance with an exemplary embodiment of the invention.

FIG. 4 is diagram 900 illustrating generated T1-weighted images, in accordance with an exemplary embodiment of the invention. T1-weighted images for three views of a human brain, i.e., sagittal, axial and coronal are generated by using equation (4). Further, a diagram 902 illustrates the sagittal view, a diagram 904 illustrates the axial view and a diagram 906 illustrates the coronal view of the human brain.

In diagram 900, in the first column, the image $S_1$ appears as a T2-weighted image for each of the views due to long $T_{SR1}$, and non-zero TE. In the second column, an addition of T1-weighting causes the image $S_2$ to be both T1 and T2 weighted. In the third column, the T2 weighing, coil sensitivity and proton density is eliminated by using equation (4). The third column illustrates purely T1-weighted images for the views.

In various embodiments of the invention, processor 122 computes mathematical formulae in equations 1–6 provided above, and in an equation 7, provided below. Processor 122 generates $S_1$ and $S_2$ image data based on received MR signals from RF coil 118. Further, processor 122 generates T1-weighted image data, based on $S_1$ and $S_2$ image data. In an embodiment of the invention, processor 122 generates T1-weighted image data by calculating a ratio $S_1/S_2$.

In various embodiment of the invention, RF coil 118 is configured to acquire MR signals corresponding to the second SSFSE image $S_2$ after the saturation recovery time period, $T_{SR2}$. In another embodiment of the invention, RF coil 118 acquires MR signals corresponding to the first SSFSE image $S_1$ at the effective echo time TE during the first acquisition and acquires MR signals corresponding to the second SSFSE image $S_2$ at the same effective echo time TE.

In various embodiments of the invention, the estimated value, $T1_{est}$ of T1 is used to calculate partial pressure of oxygen ($pO_2$) in fluids of object 126. For calculating $pO_2$ from T1, the method for generating purely T1-weighted images using data is calibrated by applying a calibration equation. In an embodiment of the invention, the calibration equation based on in-vitro calibration experiments is:

$$pO_2 = 4014 \text{ mmHg} \cdot s \times 1/T1 - 853 \text{ mmHg} \quad (7)$$

Figure 6:
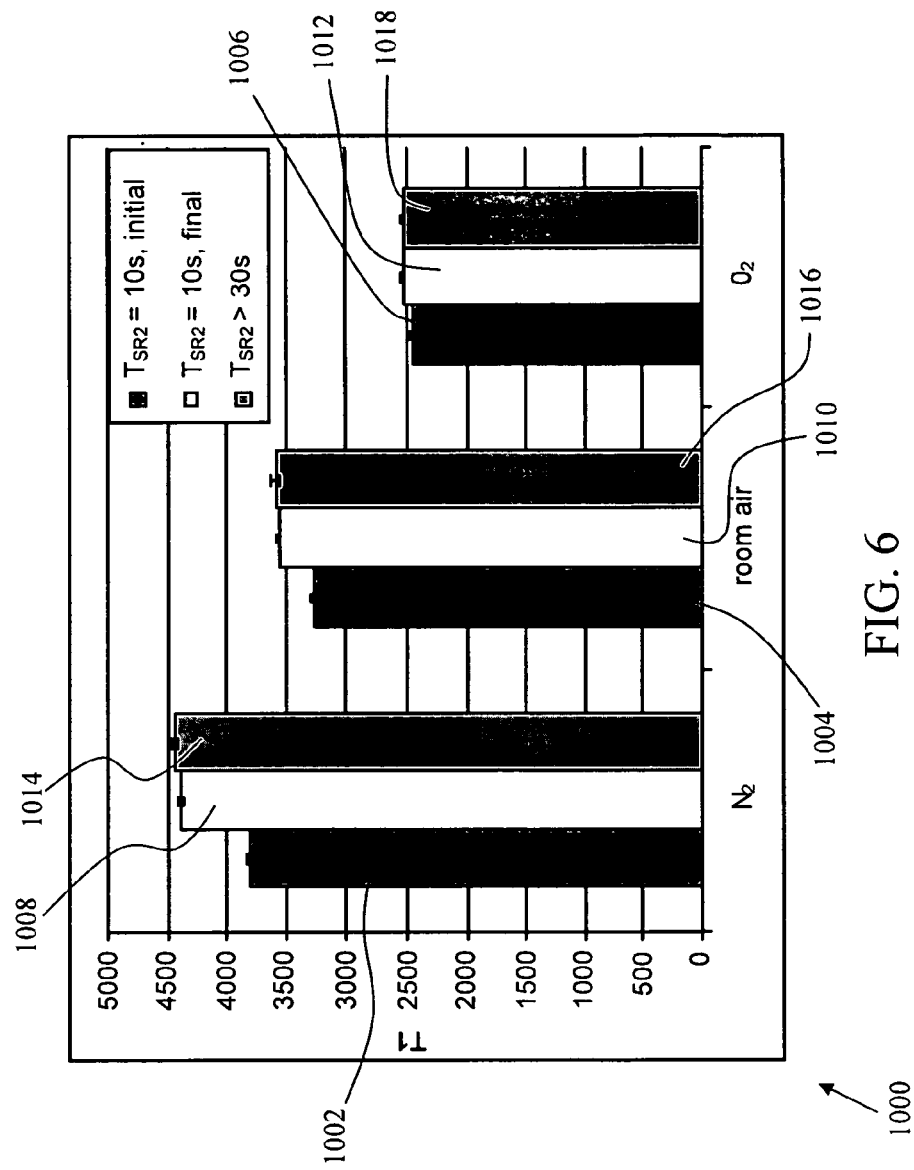
FIG. 6 is a bar graph illustrating T1 measurements in vitro, in accordance with an exemplary embodiment of the invention.
Figure 7:
FIG. 7 is a diagram illustrating T1 mapping in vivo, in accordance with an exemplary embodiment of the invention.

Exemplary variation in the value of T1 with $pO_2$ in equation 7 is demonstrated in vitro in FIG. 6 and in vivo in FIG. 7.

Figure 5:
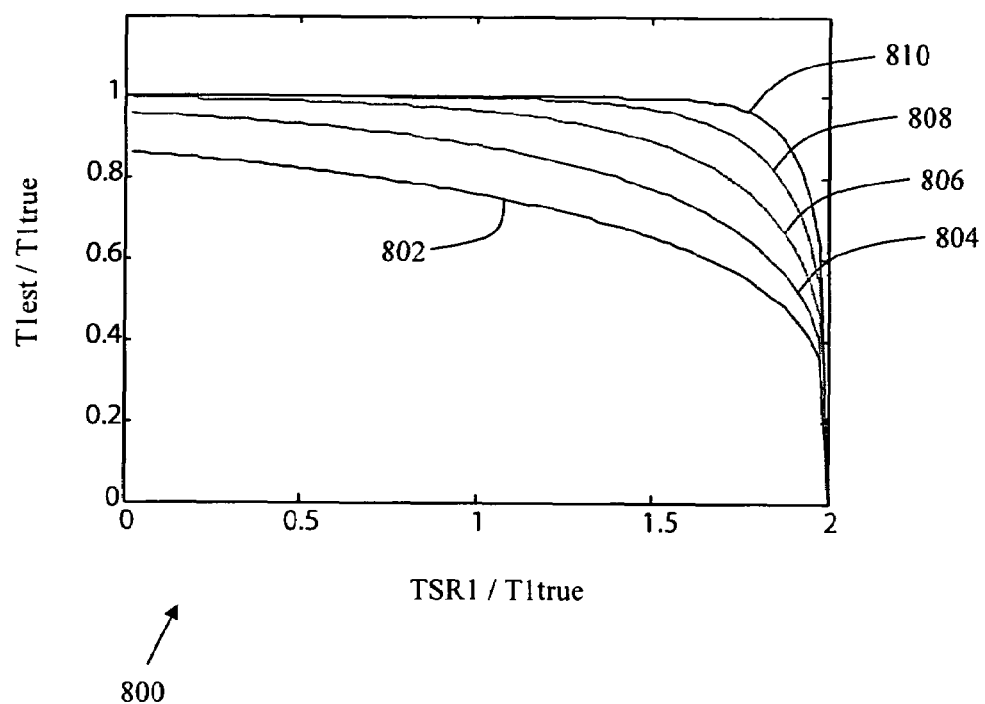
FIG. 5 is a graph illustrating iterative determination of T1, in accordance with an exemplary embodiment of the invention.

FIG. 5 is a graph 800 illustrating iterative determination of $T1_{est}$, in accordance with an exemplary embodiment of the invention. Graph 800 is based on simulated signal levels acquired for a material with known T1. A known T1 is referred to as $T1_{true}$. Graph 800 illustrates $T_{SR1}$, normalized to $T1_{true}$ on a horizontal x-axis. On a vertical y-axis, graph 800 illustrates $T1_{est}$, normalized to $T1_{true}$. Equation (5) is used iteratively to refine $T1_{est}$. In an embodiment of the invention, if $T_{SR1}$ is twice the true T1 of a material of object 126, the $T1_{est}$ is a function of $T_{SR2}$ and is shown by a curve 802. Iteration performed by processor 122 causes $T1_{est}$ to converge to $T1_{true}$. The convergence is shown by a progression from curve 802 to a curve 804, from curve 804 to a curve 806, from curve 806 to a curve 808, and from curve 808 to a curve 810.

The estimated value of T1 contains uncertainty. The uncertainty in T1 is an estimated amount or percentage by which the $T1_{est}$ differs from $T1_{true}$. The uncertainty in T1 results from noise in image data $S_2$ and image data $S_1$.

In an embodiment of the invention, the uncertainty in T1 is minimized by optimizing $T_{SR1}$ and $T_{SR2}$ for a known range of T1. In an embodiment of the invention, the optimization in $T_{SR1}$ and $T_{SR2}$ is done by applying Monte Carlo method.

In another embodiment of the invention, Propagation of error method is used for optimization.

Exemplary values obtained for optimization include $T_{SR2} \approx 0.6\ T1_{max}$ and $T_{SR1} > 2.5\ T1_{max}$, where $T1_{max}$ is the longest T1 value expected for object 126. Using these exemplary values, uncertainty in T1 is below 4.5×relative uncertainty of $S_1$ for T1 in the range of 0.4 to $1.0 \times T1_{max}$.

FIG. 6 is a bar graph 1000 illustrating T1 measurements in vitro, in accordance with an exemplary embodiment of the invention. Bar graph 1000 shows T1 values measured in distilled water samples with various $pO_2$ levels. The samples are prepared by bubbling $N_2$, room air, or $O_2$ through the distilled water. The samples are placed in a 37° C. water bath and SSFSE images are acquired at magnetic field strength of 1.5 Tesla. Thereafter, T1 is estimated for each sample.

In bar graph 1000, bars 1002, 1004, and 1006 shows an estimated T1. T1 is estimated from equation (4). However, for this estimation, $T_{SR1}$ is not substantially larger than T1. Bars 1008, 1010, and 1012 show a refined T1. The refined T1 is estimated by using the equation (5). Bars 1014, 1016, and 1018, illustrates the T1 derived from a separate acquisition. In the separate acquisition $T_{SR1}$ is substantially larger than T1. The middle bar matches the right bar to illustrate, that results obtained by using equation (5) are consistent with actual values of T1.

FIG. 7 is diagram 1100 illustrating T1 mapping in vivo, in accordance with an exemplary embodiment of the invention. Diagram 1100 is a T1 map of Cerebrospinal Fluid (CSF) in a human brain. Blue color in diagram 1100 represents T1=4.7 seconds, i.e., $pO_2$=0 mm Hg, and red color represents T1=3.85 seconds, i.e., $pO_2$=194 mm Hg. Orange-yellow-green spectrum represents T1 for $pO_2$ range of 0 mm Hg to 194 mm Hg.

Also as used herein, the phrase "image data" is not intended to exclude embodiments of the present invention in which data representing an image is generated but a viewable image is not. Therefore, as used herein the term "image data" broadly refers to both viewable images and data representing a viewable image. However, many embodiments generate (or are configured to generate) at least one viewable image.

Various embodiments of the invention provide a method for rapid T1-weighted imaging. Further, various embodiments provide a method for rapid T1 mapping of fluids that may be used for mapping partial pressure of oxygen ($pO_2$). Further, the method is non-invasive, free of contamination, and is less prone to sampling errors than invasive methods of measuring $pO_2$ in vivo.

A technical effect of the various embodiments of the invention is to enable rapid T1-weighted imaging. Another technical effect of the invention is to provide a method for rapid T1 mapping of fluids that may be used for oxygenation mapping. Yet another technical effect of the invention is to provide a method that is non-invasive, free of contamination, and less prone to sampling errors.

The various embodiments or components thereof may be implemented as part of a computer system. The computer system may include a computer, an input device, a display unit and an interface, for example, for accessing the Internet. The computer may include a microprocessor. The microprocessor may be connected to a communication bus. The computer may also include a memory. The memory may include Random Access Memory (RAM) and Read Only Memory (ROM). The computer system further may include a storage device, which may be a hard disk drive or a removable storage drive such as a floppy disk drive, optical disk drive, and the like. The storage device can also be other similar means for loading computer programs or other instructions into the computer system.

As used herein, the term "computer" may include any processor-based or microprocessor-based system including systems using microcontrollers, reduced instruction set circuits (RISC), application specific integrated circuits (ASICs), logic circuits, and any other circuit or processor capable of executing the functions described herein. The above examples are exemplary only, and are thus not intended to limit in any way the definition and/or meaning of the term "computer".

The computer executes a set of instructions that are stored in one or more storage elements, in order to process input data. The storage elements may also hold data or other information as desired or needed. The storage elements may be in the form of an information source or a physical memory element within a processing machine.

The set of instructions may include various commands that instruct the processing machine to perform specific operations such as the processes of the various embodiments of the invention. The set of instructions may be in the form of a software program. The software may be in various forms such as system software or application software. Further, the software may be in the form of a collection of separate programs, a program module within a larger program or a portion of a program module. The software also may include modular programming in the form of object-oriented programming. The processing of input data by the processing machine may be in response to user commands, or in response to results of previous processing, or in response to a request made by another processing machine.

As used herein, the terms "software" and "firmware" are interchangeable, and include any computer program stored in memory for execution by a computer, including random access memory (RAM), read-only memory (ROM), erasable programmable ROM (EPROM), electrically erasable EPROM (EEPROM), and non-volatile RAM (NVRAM). The above memory types are exemplary only, and are thus not limiting as to the types of memory usable for storage of a computer program.

While the invention has been described in terms of various specific embodiments, those skilled in the art will recognize that the invention can be practiced with modification within the spirit and scope of the claims.

What is claimed is:

1. A magnetic resonance imaging (MRI) system comprising:
   a radio frequency (RF) coil configured to acquire a first set of MR signals and a second set of MR signals; and
   a processor configured to:
   generate T2-weighted image data S1 corresponding to the first set of MR signals;
   generate T1–T2 weighted image data S2 corresponding to the second set of MR signals; and
   generate T1-weighted image data from the T2-weighted image data and the T1–T2 weighted image data, wherein said processor is configured to generate the T1-weighted image data by computing a ratio S2/S1.

2. An MRI system in accordance with claim 1 wherein the RF coil is configured to acquire the second set of MR signals after a saturation recovery time period $T_{SR2}$ and the RF coil is configured to acquire the first and second sets of MR signals at an effective echo time.

3. A method for generating T1 information, said method comprising:
   generating T2-weighted image data $S_1$;
   generating T1–T2 weighted image data $S_2$;
   generating a set of T1-weighted image data from the T2-weighted image data and the T1–T2 weighted image data;

determining a plurality of saturation recovery time periods $T_{SR1}$ and $T_{SR2}$ by applying at least one of a Monte Carlo method and a propagation of error method.

4. A method for generating T1 information, said method comprising:
generating T2-weighted image data $S_1$;
generating T1–T2 weighted image data $S_2$;
generating a set of T1-weighted image data from the T2-weighted image data and the T1–T2 weighted image data;
selecting $T_{SR1}$ and $T_{SR2}$ to minimize an error in estimating T1, the error resulting from a presence of noise in $S_1$ and $S_2$.

5. A method for generating T1 information, said method comprising:
generating T2-weighted image data $S_1$;
generating T1–T2 weighted image data $S_2$;
generating a set of T1-weighted image data from the T2-weighted image data and the T1–T2 weighted image data;
repeating acquisitions of the T2-weighted image data and the T1–T2-weighted image data;
averaging the T2-weighted image data from the acquisitions to generate a first average;
averaging the T1–T2 weighted image data from the acquisitions to generate a second average; and
generating an average T1-weighted image data from a ratio of the first and second averages.

6. A method in accordance with claim 5 further comprising calculating a partial pressure of oxygen from a T1 relaxation time calculated from data within the T1-weighted image.

7. A method in accordance with claim 5 further comprising:
acquiring via a radio frequency (RF) coil a first set of magnetic resonance (MR) signals corresponding to the T2-weighted image data; and
acquiring via the same RF coil a second set of MR signals corresponding to the T1–T2 weighted image data.

8. A method in accordance with claim 5 further comprising:
acquiring a first set of magnetic resonance (MR) signals corresponding to the T2-weighted image data; and
acquiring a second set of MR signals corresponding to the T1–T2 weighted image data, wherein said acquiring the second set of MR signals comprises obtaining the second set of MR signals after a saturation recovery time period $T_{SR2}$.

9. A method in accordance with claim 5 further comprising setting a saturation recovery time period $T_{SR2}$ between acquiring the T2-weighted imaged data and acquiring the T1–T2 weighted image data.

10. A method in accordance with claim 5 further comprising:
acquiring a preceding set of magnetic resonance (MR) signals corresponding to the T2-weighted image data;
acquiring a current set of MR signals corresponding to the T1–T2 weighted image data; and
setting a saturation recovery time period $T_{SR1}$ of the preceding set of MR signals.

11. A method for generating T1 information, said method comprising:
generating T2-weighted image data $S_t$;
generating T1–T2 weighted image data $S_2$,
generating a set of T1-weighted image data from the T2-weighted image data and the T1–T2 weighted image data;
acquiring at an effective echo time a first set of magnetic resonance (MR) signals corresponding to the T2-weighted image data; and
acquiring at the same effective echo time a second set of MR signals corresponding to the T1–T2 weighted image data.

12. A method for generating purely T1-weighted images, said method comprising:
acquiring a pair of single-shot-fast-spin-echo (SSFSE) images $S_1$ and $S_2$; and
generating a T1-weighted image $S_{T1w}$ based on $S_1$ and $S_2$, wherein said generating the T1-weighted image comprises computing a ratio $S_2/S_1$.

13. A method in accordance with claim 12 wherein acquisition of the SSFSE image $S_1$ saturates a magnetization and the SSFSE image $S_2$ is acquired with T1 weighting resulting from a finite saturation recovery rime $T_{SR2}$ between the acquisition of the SSFSE image $S_1$ and the acquisition of the SSFSE image $S_2$.

14. A method in accordance with claim 12 wherein a saturation recovery period $T_{SR1}$ prior to acquiring the SSFSE image $S_1$ is one of substantially greater than T1 to consider T1 recovery complete and a known finite value.

15. A method in accordance with claim 12 further comprising:
computing an initial T1 relaxation time at one of each pixel within a region of interest (ROI) and from data within the T1-weighted image; and
iteratively computing a refined T1 relaxation time from the initial T1 relaxation time and the data.

16. A method in accordance with claim 12 wherein at least one of S1 and S2 acquisitions are repeated multiple times and averaged prior to calculating the T1-weighted image.

17. A method for generating purely T1-weighted images, said method comprising:
acquiring a pair of single-shot-fast-spin-echo (SSFSE) images $S_1$ and $S_2$; and
generating a T1-weighted image $S_{T1w}$ based on $S_1$ and $S_2$, wherein the SSFSE images are generated based on identical T2-weighting and different amounts of T1-weighting, and the different amounts of T1-weighting is generated from different values of $T_{SR1}$ and $T_{SR2}$.

* * * * *